United States Patent [19]

Yamashita et al.

[11] Patent Number: 5,252,414
[45] Date of Patent: Oct. 12, 1993

[54] EVALUATION METHOD OF RESIST COATING

[75] Inventors: Kazuhiro Yamashita, Amagasaki; Hironao Iwai, Osaka; Noboru Nomura, Kyoto, all of Japan

[73] Assignee: Matsushita Electric Industrial Co., Ltd., Osaka, Japan

[21] Appl. No.: 747,619

[22] Filed: Aug. 20, 1991

[30] Foreign Application Priority Data

Aug. 20, 1990 [JP] Japan ................................ 2-219254

[51] Int. Cl.⁵ .............................................. G03F 9/00
[52] U.S. Cl. ....................................... 430/22; 430/324; 430/328; 430/394
[58] Field of Search ................. 430/22, 324, 311, 327, 430/328, 330, 394

[56] References Cited

U.S. PATENT DOCUMENTS

| | | | |
|---|---|---|---|
| 4,548,688 | 10/1985 | Matthews | 430/330 |
| 4,808,501 | 2/1989 | Chiulli | 430/330 |
| 4,837,098 | 6/1989 | Shimamura | 430/330 |
| 5,096,802 | 3/1992 | Hu | 430/330 |

FOREIGN PATENT DOCUMENTS

| | | | |
|---|---|---|---|
| 59-96729 | 6/1984 | Japan | 430/22 |
| 1-125824 | 5/1989 | Japan | 430/22 |

OTHER PUBLICATIONS

K. Yamashita et al., "Heterodyne Holographic Nanometer Alignment For a Half-Micron Wafer Stepper", Reprinted from Optical/Laser Microlithography III, SPIE, vol. 1264, pp. 219-226 (1990).

Primary Examiner—Marion E. McCamish
Assistant Examiner—Kathleen Duda
Attorney, Agent, or Firm—Ratner & Prestia

[57] ABSTRACT

A method for evaluating a resist coating comprising the steps of: forming a first layer resist pattern including an alignment mark by applying a first resist on a semiconductor substrate and by exposing and developing said first resist, said first layer resist pattern having a ridge portion; irradiating said first layer resist pattern with a deep ultraviolet ray; applying, onto said irradiated first layer resist pattern, a second resist having substantially the same refractive index as said first resist to form a second resist coating; detecting said alignment mark formed in said first layer resist pattern, and relatively positioning a pattern for said second resist and said first layer resist pattern; and determining nonuniformity characteristics of said second resist coating by measuring an overlay accuracy between said first layer resist pattern and said pattern for said second resist. The present invention ensures a quantitative evaluation in a non-contact manner for non-uniformity of a resist coating, and enables a resist coating method to be optimized.

4 Claims, 8 Drawing Sheets

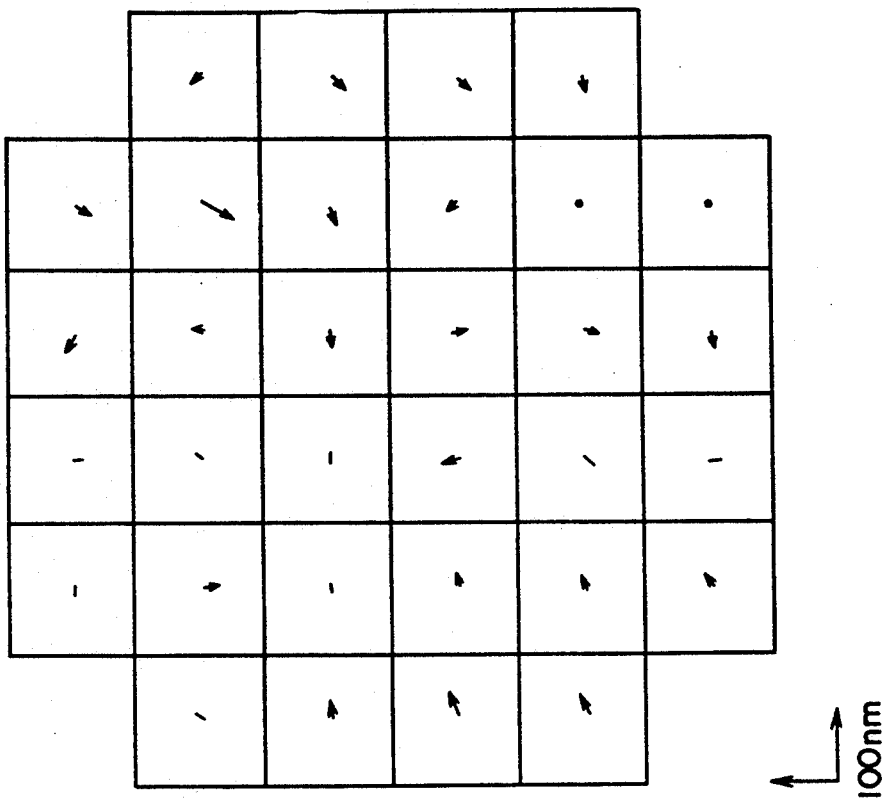
FIG.5(b)   X = -0.4nm   Y = -0.3nm   3σx = 59nm   3σx = 54nm
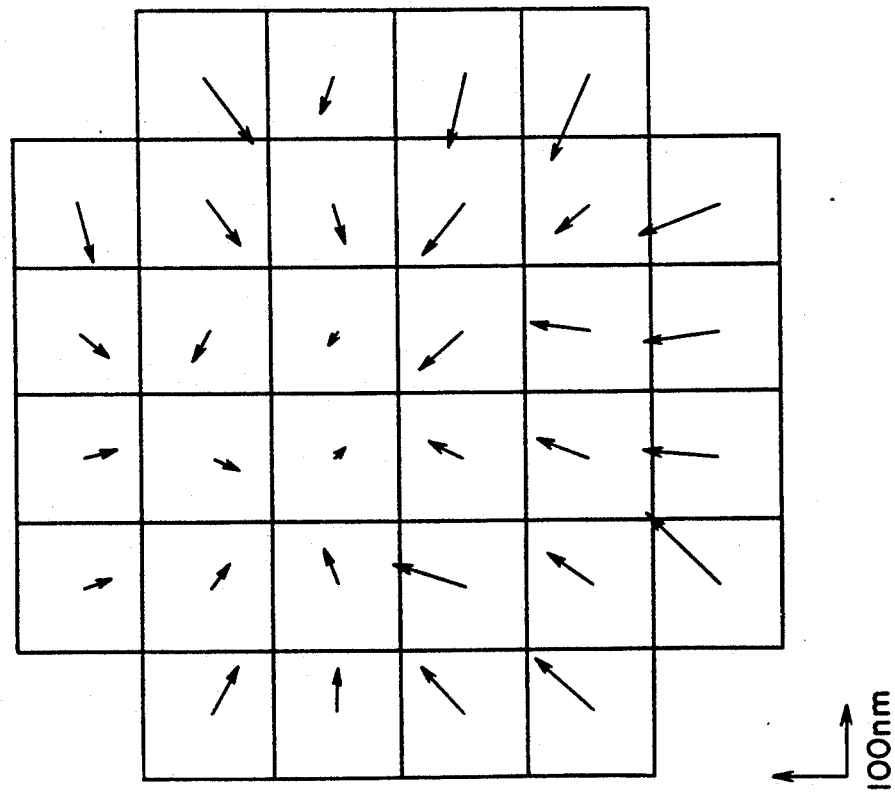
FIG.5(a)   X = -10nm   Y = 28nm   3σx = 192nm   3σx = 179nm

FIG.6(a)
(PRIOR ART)
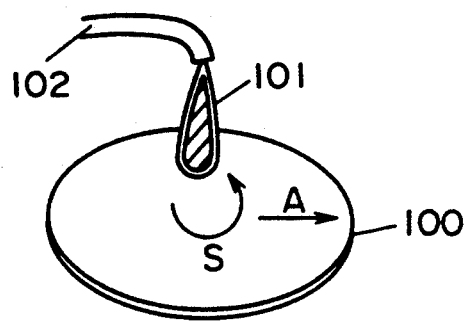
FIG.6(b)
(PRIOR ART)
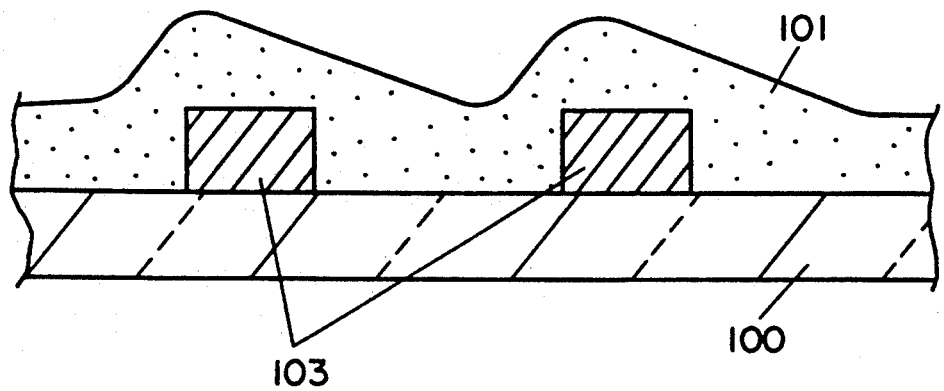

EVALUATION METHOD OF RESIST COATING

BACKGROUND OF THE INVENTION

The present invention relates to a semiconductor device fabrication process and more particularly to an evaluation method of a resist coating in a semiconductor lithography process.

Currently, optical lithography technology using a reduction projection exposure apparatus is employed in the fabrication process of semiconductor devices or the like.

Optical lithography mainly comprises the steps of resist application, exposure, development and baking. The resist application step is particularly important. A well-controlled formation of fine patterns by optical lithography requires a uniformly applied Spin Coat of a resist on a substrate surface.

FIG. 6(a) is a perspective view of a prior art method for applying a resist and FIG. 6(b) is a sectional view of a resist applied on a semiconductor substrate.

In a manner shown in FIG. 6(a), resist 101 is dropped from a nozzle 102 onto a semiconductor substrate (a wafer) 100, and the semiconductor substrate 100 is revolved by means of a spinner. Thereby, a uniformly applied spin coat can be obtained on the semiconductor substrate for a simple case. However, if a semiconductor substrate has thereon a ridge 103 (such as wiring, as shown in the example of FIG. 6(b)), resist locally accumulates at a particular region neighboring ridge 103 depending on the spinner revolution speed and the resist viscosity or the like. This local accumulation results in a non-uniform coat over the ridge. In FIG. 6(a) and (b), an arrow A indicates a flow direction of resist and another arrow S indicates a revolution direction.

In preparation for the subsequent pattern exposure step, the semiconductor substrate 100 is aligned with a photomask (omitted from the drawing) which is to be placed on the substrate. The alignment mark on the substrate 100 is optically detected and, in response, an electric signal is generated. The above alignment is conducted in accordance with the electric signal, so that the photomask and substrate 100 are accurately positioned relative to each other. Then, the resist is exposed and developed selectively to form a pattern of resist 101.

If the aforementioned non-uniform coat takes place and is subject to these pattern exposure steps, the non-uniform coat lowers the alignment accuracy between the photomask and substrate 100. This insufficient alignment accuracy results in an insufficient dimensional accuracy of a formed resist pattern. FIG. 7(a) and (b) show an undesirable example, in which resist 101 is non-uniformly applied over a ridge (i.e. an alignment mark 103A), and a detection signal wave form 104 is asymmetrically deformed. Therefore, the non-uniform coat of FIG. 7(a) causes an erroneous detection of the alignment mark and, accordingly, an undesirable deviation 105 in positioning a photomask over the substrate.

On the basis of this background, there is a need for the resist coating method to be optimized in order to prevent a non-uniform resist coating over a ridge from occurring. However, there are no satisfactory methods hitherto to evaluate quantitatively an applied resist coating. With respect to the prior art methods to evaluate the uniformity of resist applied on a semiconductor substrate, one method employs thickness measurement making use of an optical interference, and another method employs a mechanical means to bring a small needle in contact with a semiconductor substrate and to scan it. The former method has a drawback that the location of the measurement point is limited within a scope of an object lens of a microscope, which does not allow a measurement of a resist thickness difference between the ridge top and the depression to be measured. Thus, the accurate evaluation of the resist coat non-uniformity is interrupted. The latter method has a drawback that a finite diameter of a needle end used for the ridge measurement makes it impracticable to measure resist film thicknesses at the ridge top and the depression of the fine pattern. Moreover, the contact type arrangement is likely to damage the resist.

SUMMARY OF THE INVENTION

An object of the present invention is to provide an accurate method for quantitatively evaluating non-uniformity between a ridge top and a depression of a resist coating.

In accordance with the present invention, there is provided a method for evaluating a resist coating comprising the steps of:

forming a first layer resist pattern including an alignment mark by applying a first resist on a semiconductor substrate and by exposing and developing said first resist, said first layer resist pattern having a ridge portion;

irradiating said first layer resist pattern with a deep ultraviolet ray;

applying, onto said irradiated first layer resist pattern, a second resist having substantially the same refractive index as said first resist to form a second resist coating;

detecting said alignment mark formed in said first layer resist pattern, and relatively positioning a pattern for said second resist and first layer resist pattern; and determining non-uniformity characteristics of said second resist coating by measuring an overlay accuracy between said first layer resist pattern and said pattern for said second resist.

The present invention ensures a quantitative evaluation in a non-contact manner for non-uniformity of resist coating, and enables a resist coating method to be optimized.

First, a resist coating formed under a certain condition is evaluated in accordance with the present invention and a corresponding evaluation result is obtained. In view of the obtained result, some changes are made in the resist viscosity, the revolutions per unit time of the semiconductor substrate at the time of resist application and the resist dropping method, so that the non-uniformity of the resist coating is rectified. After such changes are made the next resist coating is conducted and the non-uniformity of the coating is evaluated in accordance with the present invention. These operations are repeated and thus the optimization of the resist coating method is precisely achieved.

Consequently, the resist uniformity is improved and no resist pattern dimensional error occurs after the exposure step due to the non-uniform thickness of the resist coating surface at a location of an underlying ridge. At the same time, the resist coating method, optimized through a series of evaluations and rectifications in accordance with the present invention, excludes an occurrence of misalignment between the overlaid pattern and the underlying pattern resulting from the non-uniformity of the resist coating.

Thus a use of a method of the present invention ensures an improvement in the line width accuracy (the pattern accuracy) and the overlay accuracy and an improvement in the integration of a semiconductor integrated circuit.

In a preferred embodiment of the aforementioned method of the present invention, the steps after the second resist applying step may comprise:

determining non-uniformity characteristics of the second resist coating by irradiating the alignment mark in the first layer resist pattern with a coherent ray and by detecting a reflected ray from the alignment mark, or alternatively may comprise:

forming a second layer resist pattern by detecting the alignment mark formed in the first layer resist pattern, by relatively positioning a pattern for the second resist and the first layer resist pattern and by exposing and developing the second resist; and determining non-uniformity characteristics of the second resist coating by measuring a misalignment between the first layer resist pattern and the second layer resist pattern.

In another exemplary embodiment, prior to and subsequent to the steps of applying the second resist, position detections may be performed with respect to the alignment mark in the first layer resist pattern; and the steps of determining non-uniformity characteristics of the second resist coating may be carried out by measuring changes in at least one of wafer scaling, orthogonality and wafer rotation of the semiconductor substrate.

The steps of forming the second layer resist pattern may include relative positioning of the first layer resist pattern and the pattern for the second resist making use of two rays' interference.

The method may comprise, in replacement of the deep ultraviolet ray irradiating step, a step of baking the first layer resist patten by means of a hot plate.

The difference in the refractive index between the first resist and the second resist is preferably at most 0.1.

BRIEF DESCRIPTION OF THE DRAWINGS

Embodiments of the invention will now be described by way of example only, in conjunction with the attached drawings in which:

FIGS. 5(a) and 5(b) are graphs showing results of resist coating non-uniformity evaluations conducted in accordance with the present invention; and FIGS. 6(a), 6(b), 7(a) and 7(b) are explanatory views of a prior art method of resist coating accompanied with the problem of non-uniformity.

DETAILED DESCRIPTION OF THE INVENTION

FIGS. 1(a)-1(f) show steps of an embodiment of a method according to the present invention for evaluating a non-uniformity of the resist coating.

Figure 1A:
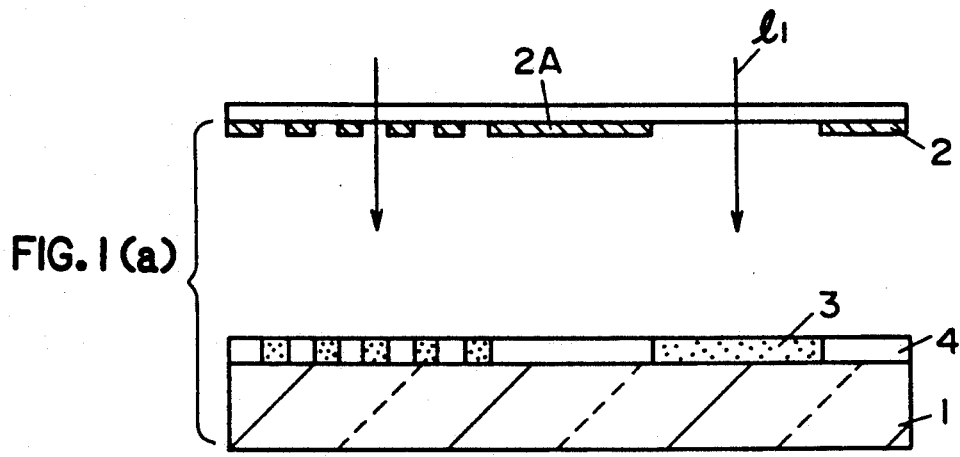
FIGS. 1(a)-1(f) are explanatory views showing the steps of a method of the present invention for evaluating the non-uniformity of a resist coating.

As shown in FIG. 1(a), the first photoresist of novolak is applied by spin coat on a semiconductor substrate with a coating thickness being from 0.5 $\mu$m to 1.5 $\mu$m. The first resist is then prebaked for about 90 seconds by means of a hot plate. The first photoresist is next selectively exposed using a reduction projection wafer stepper with a photomask having the first pattern. The reference 2A is a masked region, the numeral 3 is an exposed resist region, and the numeral 4 is an unexposed resist region.

Figure 1B:
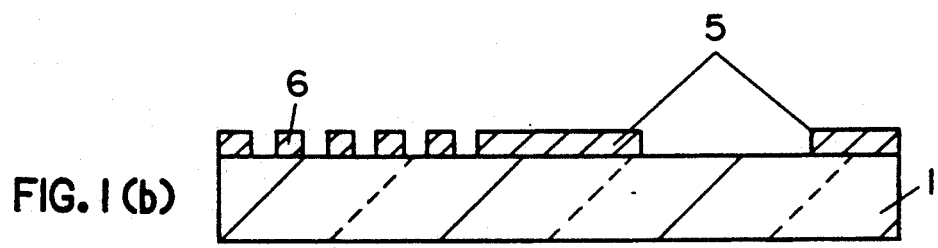

After this exposure, the resist is developed and the first layer resist pattern 5 is formed as shown in FIG. 1(b). At this step, an arrangement shall be made so that a part of the resist forms an alignment grating 6.

Figure 1C:
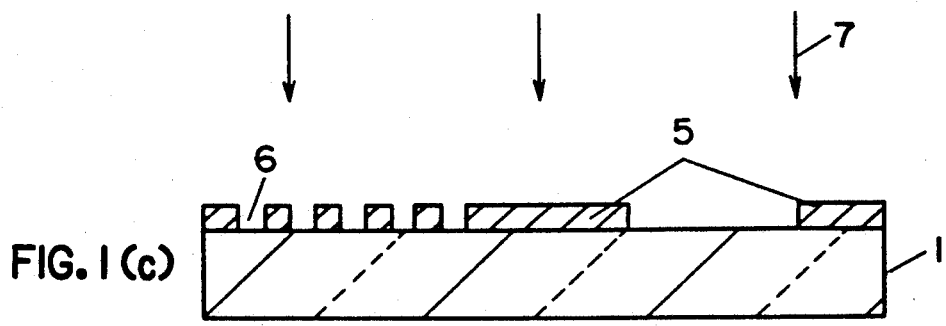

The entire surface of the first layer resist pattern 5 is irradiated with a deep ultraviolet ray (DUV) 7 as shown in FIG. 1(c), so that the surface of the first layer resist pattern 5 is cured and no mixing occurs later between the first layer resist and a resist subsequently coated thereon.

Figure 1D:
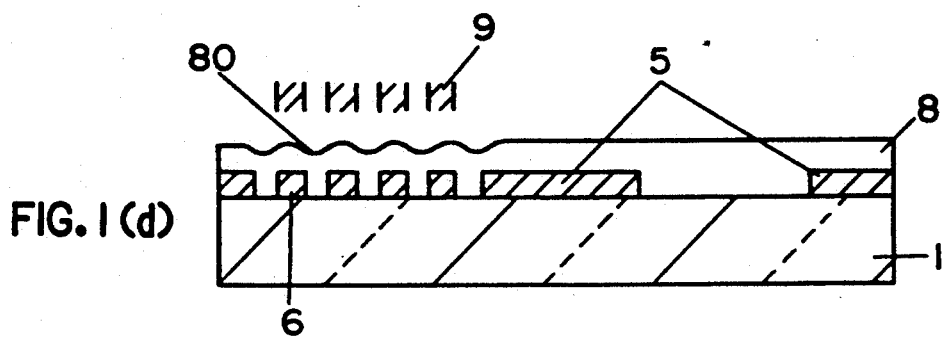

Thereafter, a resist having substantially the same refractive index or a difference not greater than 0.1 as the first layer resist is applied on the first layer resist pattern 5. That is, the second photoresist 8 of the same material as the first is applied and prebaked as shown in FIG. 1(d). The numeral 80 is a portion of the resist 8 which is to be subjected to a measurement for non-uniformity of the resist coating. At this moment, the first layer resist pattern has been irradiated with DUV and the surface thereof has been cured, and therefore the second resist 8 does not mix with the underlying first layer resist pattern.

Then, the wafer alignment method using two rays' interference is used and the relative position adjustment is completed between the two rays' interference fringe 9 and the wafer alignment grating 6 formed in the first layer.

Figure 4B:
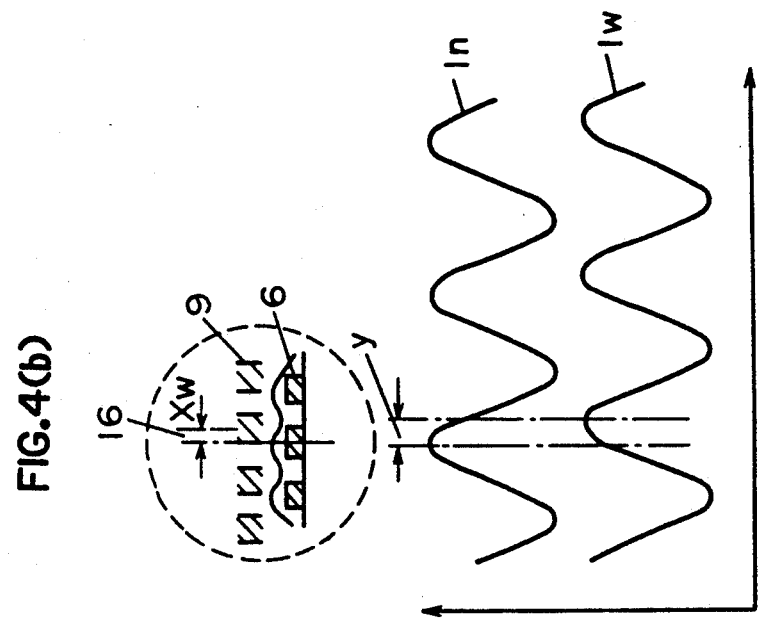
FIGS. 4a and 4b illustrate a schematic view of an optical system for alignment employable in an exposure apparatus which is capable of practicing an evaluation of a non-uniform resist coating in accordance with the present invention.
Figure 4A:
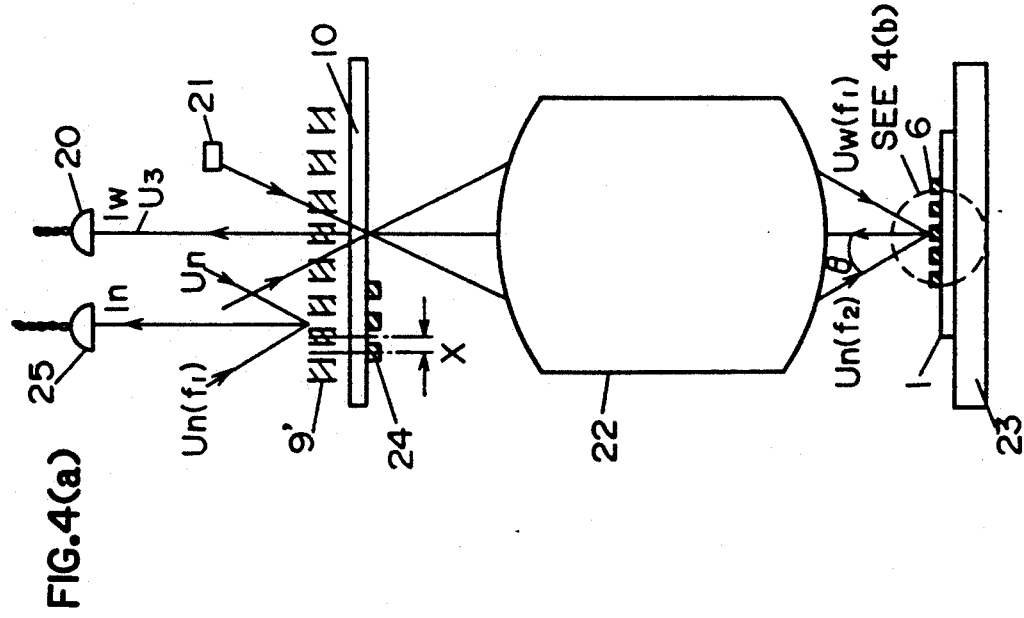
Figure 7A:
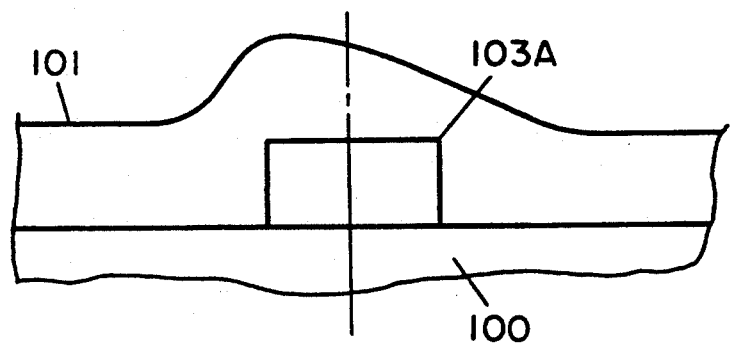
Figure 7B:
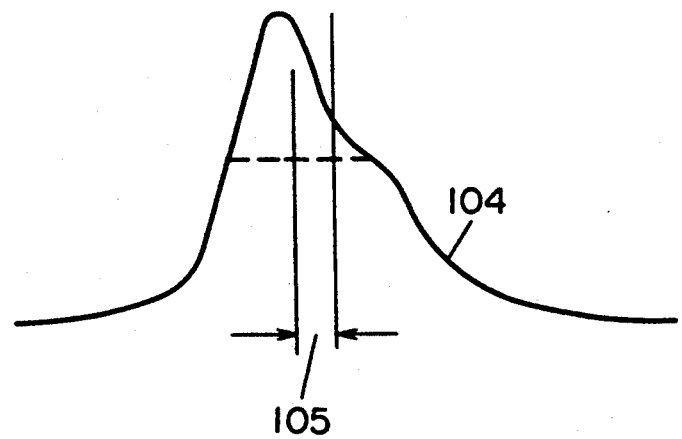

The above mentioned interference fringe 9 is accurately aligned with the alignment grating 24 of the photomask 10 as illustrated in FIG. 4(a). Accordingly the position of the interference fringe 9 correctly represents the position of photomask 10. Thus, the alignment between the interference fringe 9 and grating 6 formed at a part of the first layer resist pattern 5 has the same effect as the alignment between photomask 10 and the substrate 1.

Figure 1E:
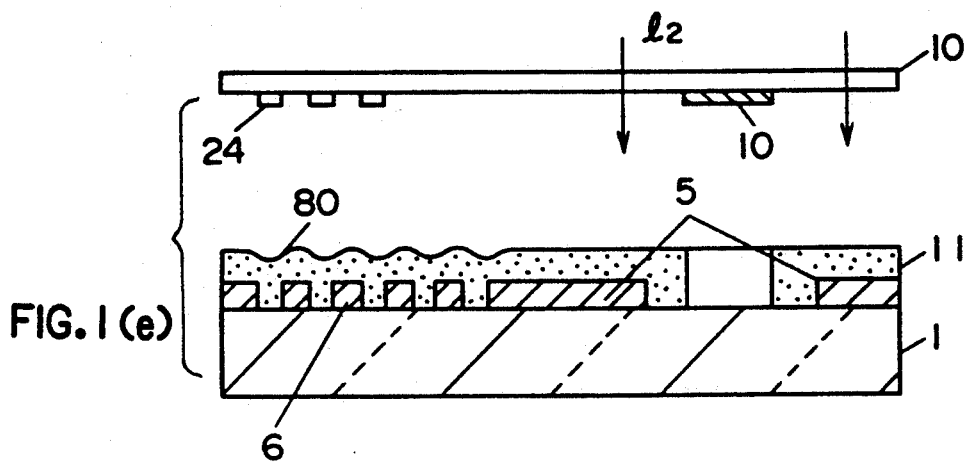
Figure 1F:
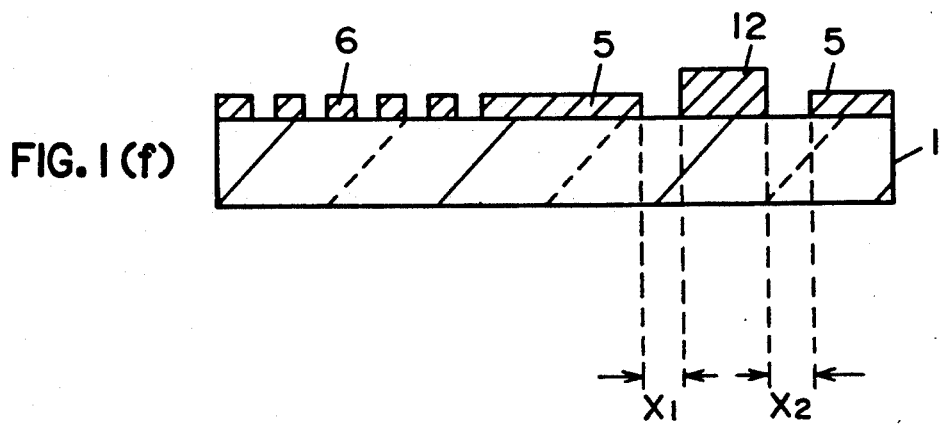

With the photomask 10 having the second pattern and having been aligned in this manner, the second resist 8 on the first layer resist pattern is then exposed and developed as shown in FIG. 1(e)) so that the second layer resist pattern 12 is formed. During this step the first layer resist pattern 5 and the grating 6 are not dissolved by the exposure and the development, because the resist pattern 5 and the grating 6 have been irradiated with DUV.

Thereafter, the misalignment is measured between the first layer resist pattern 5 and the second layer resist pattern 12. For this purpose, the deviation between the center of the depression of the first layer resist pattern 5 and the center of the second layer resist pattern 12 are measured in terms of $(X_1-X_2)/2$. This measurement enables a non-uniformity of a resist coating over a ridge to be quantitatively determined.

Figure 2:
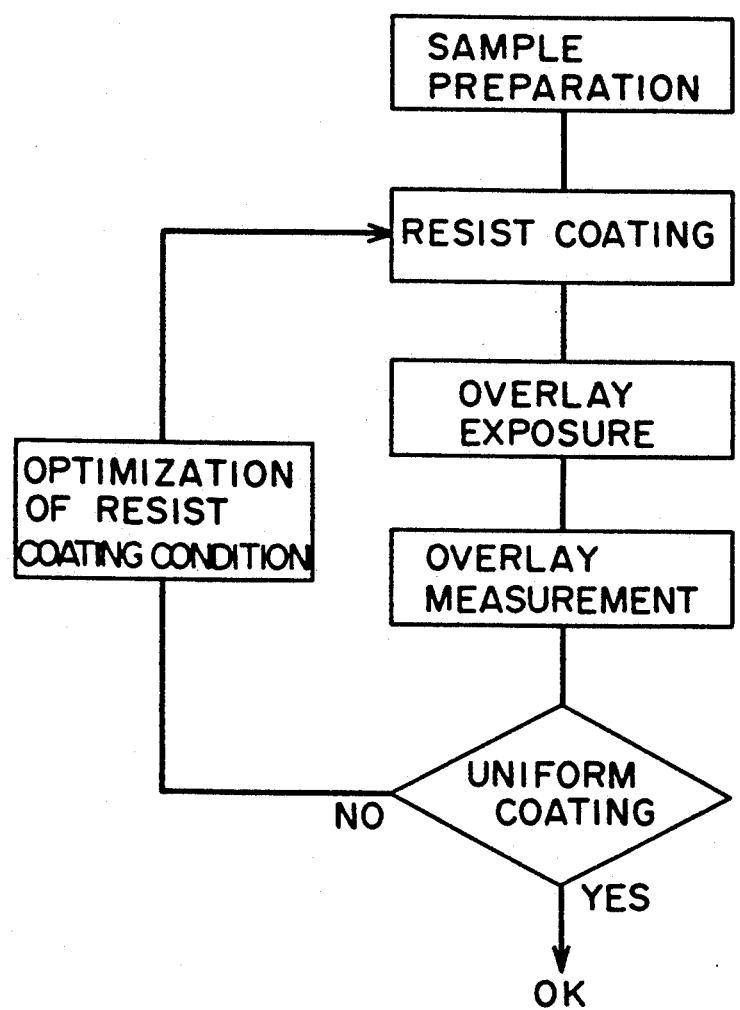
FIG. 2 is a flow chart showing a procedure to optimize a resist coating method.

FIG. 2 shows a procedure to optimize a method to provide a uniform resist coating, which comprises the steps of preparing a sample material, applying the resist, aligning and exposing the resist, measuring the misalignment, and optimizing the resist applying condition. In a manner shown in FIGS. 1(a)-1(f), the uniformity of the resist coating is evaluated, and if the result shows the resist coating to be non-uniform then the resist coating condition (including the number of revolutions for coating, the dispense volume and the viscosity) is changed so that the resist coating method is optimized.

Figure 3A:
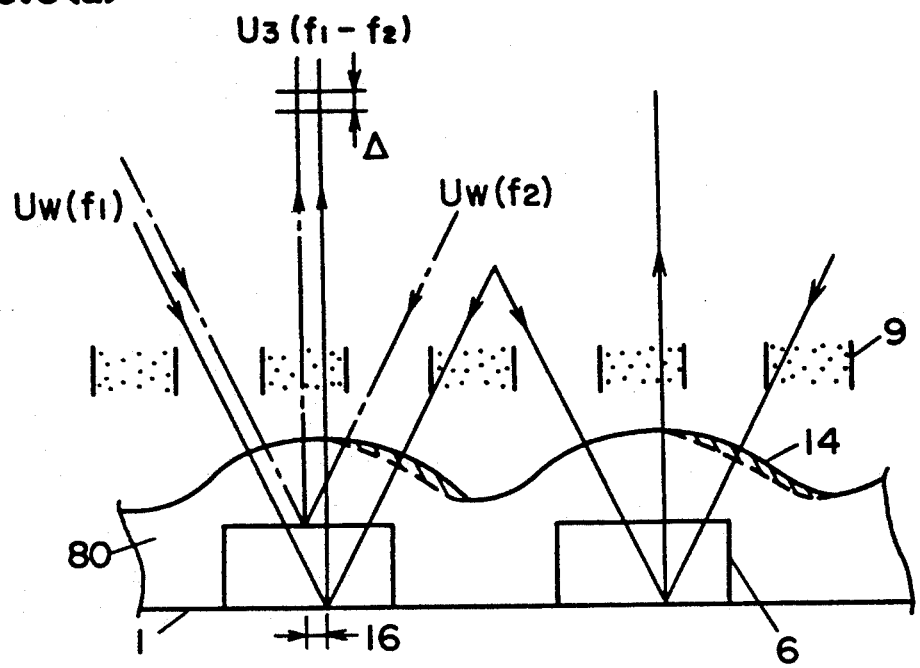
FIGS. 3(a) and 3(b) are explanatory views of the principle underlying a method of the present invention for evaluating the non-uniformity of a resist coating.
Figure 3B:
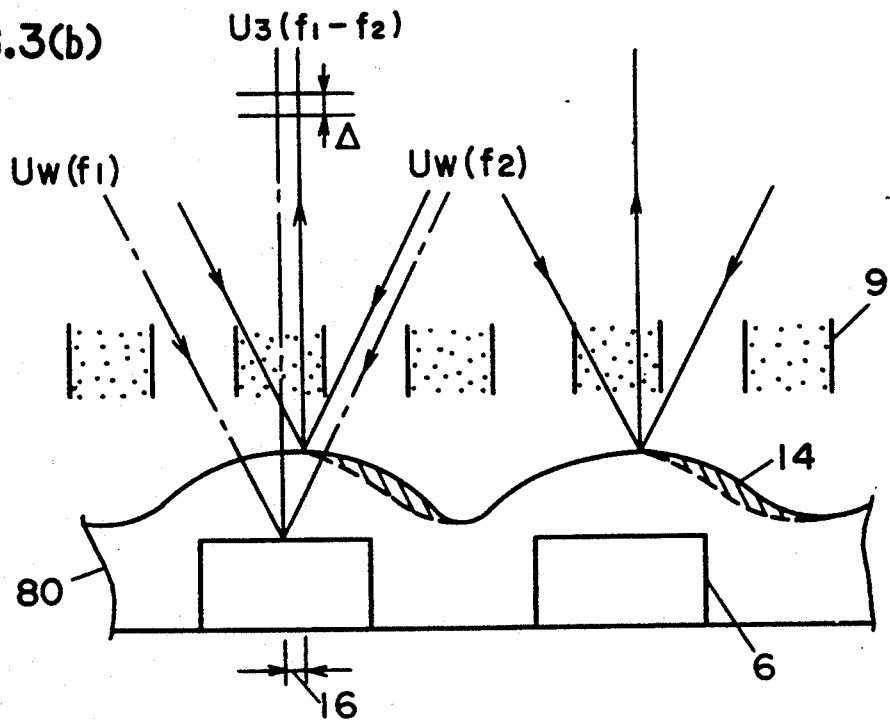

FIGS. 3(a) and 3(b) show the principle of measurement of the resist coating non-uniformity using the two rays' interference in accordance with FIG. 2. FIGS. 3(a) and 3(b) include two cases, namely a case (FIG. 3(a)) in which the reflection from the substrate is predominant over the reflection from the top surface and another case (FIG. 3(b)) in which, on the contrary, the reflection from the top surface is predominant over the reflection from the substrate. In both drawings, a ray illustrated by a solid line represents a state with a resist and a ray illustrated by a dash-dot line represents a state without a resist.

In the former case (FIG. 3(a)), two coherent rays $U_W(f_1)$ and $U_W(f_2)$ having slightly different wavelengths are irradiated onto the wafer alignment grating 6 in the first layer pattern of the resist coating. These two rays intersect above the semiconductor substrate and generate interference fringe 9.

As previously mentioned with reference to FIGS. 1a-1f (a), the interference fringe 9 is aligned with the alignment grating 24 on the photomask 10 and is the standard of the relative positioning between the photomask 10 and the wafer alignment grating 6 on the semiconductor substrate.

The wafer alignment grating 6 has been irradiated with DUV and has almost the same refractive index as the upper layer resist coating, and does not mix with the latter. Each incident beam passes through the resist and reflects from the semiconductor substrate 1 as illustrated in FIG. 3(a), which corresponds to a case in which the reflection from the substrate is predominant over the reflection from the top surface. The respective incident beams $Uw(f_1)$ and $Uw(f_2)$ are reflected at the substrate 1. Beams reflected in perpendicular to the substrate interfere with each other and provide a beat signal. The phase of the beat signal contains position information of the wafer alignment grating 6, and the alignment is carried out by making the interference fringe 9 and the grating 6 coated with the resist positioned relative to each other.

As a result, the photomask 10 and the semiconductor substrate 1 are aligned with each other. At this step, if there is a non-uniform portion 14 in the resist 80, an optical path difference occurs between the beams $Uw(f_1)$ and $Uw(f_2)$ while the beams pass through different regions of the resist, resulting in a deviation (misalignment) 16. In other words, the non-uniformity 14 of the resist coating can be determined by measuring the deviations 16 before and after the resist coating step.

In the case of FIG. 3(b), in which the reflection from the top surface is predominant over the reflection from the substrate, a position change of the diffraction center from before the resist coating step to after the resist coating step causes a corresponding phase deviation. The resultant phase difference between the beams $U_1$ and $U_2$ causes a phase deviation in the beat signal of the detection beam, resulting in a deviation (misalignment) 16 relative to the interference fringe.

If there is a deviation (misalignment), i.e. non-uniformity of the resist coating, the condition of the resist coating (including the number of revolutions for coating, the dispense volume and the viscosity) is changed so that a deviation (misalignment), i.e. non-uniformity of the resist coating, does not occur and the resist coating is optimized.

FIG. 4(a) and FIG. 4(b) shows an optical system for alignment in an exposure apparatus which is capable of practicing an evaluation of a non-uniform resist coating in accordance with the present invention. The numeral 10 is a photomask, the numeral 21 is an acoustic oscillator, the numeral 22 is a reduction projection lens, the numeral 23 is a wafer stage, and the 24 is an alignment grating on the photomask. The numeral 6 is an alignment grating on a resist-coated wafer. $I_n$ and $I_W$ are heterodyne signals.

Two coherent rays $Uw(f_1)$, $Uw(f_2)$ respectively having slightly different frequencies $f_1$, $f_2$ are irradiated onto a substrate 1 at an incident angle $\theta$, and interference fringe 9' and 9 (providing an alignment standard) are respectively formed above the photomask 10 and the substrate 1. The interference fringe 9' has a pitch P', and the interference fringe 9 has a pitch P. If the magnification of projection is represented by m, the pitch P' of the interference fringe 9' is equal to mP. The pitch P of the interference fringe 9 is described by the following formula:

$$P = \lambda / (2 \sin \theta)$$

The photomask 10 has the alignment grating 24 at a pitch which is a multiple (a multiple-by-integer) of the pitch P' of the interference fringe 9' above the photomask 10. While on the semiconductor substrate 1, there is formed the first pattern including an alignment grating 6 a pitch of which is a multiple-by integer of the pitch P of the interference fringe 9.

If the incident rays are represented by $U_W(f_1)$ and $U_W(f_2)$, rays diffracted due to the alignment grating 6 on the semiconductor substrate 1 are described by the following formulas:

$$U_W(f_1) = A_W(f_1) \cdot \exp\{i(2\pi f_1 t - \delta)\}$$

$$U_W(f_2) = B_W(f_2) \cdot \exp\{i(2\pi f_2 t + \delta)\}$$

Wherein $\delta$ is a phase difference of a diffracted ray caused by a movement $X_W$ of a semiconductor alignment grating, which is described by the following formula:

$$\delta_W = 2\pi \cdot X_M \cdot \sin\theta / \lambda$$

From these equations, interference ray intensity of a diffracted ray of a ±1st order ray is expressed by the following formula:

$$I_W = |U_W(f_1) + U_W(f_2)|^2$$

$$A_W(f_1)^2 + B_W(f_2)^2 + 2A_W(f_1) \cdot B_W(f_2) \cdot \cos\{2\pi(f_1 - f_2)t - 2\delta\}$$

$$A_W(f_1)^2 + B_W(f_2)^2 + 2A_W(f_1) \cdot B_W(f_2) \cdot \cos\{2\pi(f_1 - f_2)t - 2X_W/P\}$$

In a similar manner, rays diffracted due to an alignment grating on a photomask are described by the following formulas:

$$U_n(f_1) = A_M(f_1) \cdot \exp\{i(2\pi f_1 t - \delta)\}$$

$$U_n(f_2) = B_M(f_2) \cdot \exp\{i(2\pi f_2 t + \delta)\}$$

Wherein $\delta$ is a phase difference of a diffracted ray caused by a movement $X_M$ of a photomask relative to 2 rays' interference fringe 9', which is described by the following formula:

$$\delta_M = 2\pi \cdot X_M \cdot \sin\theta / \lambda$$

From these equations, interference ray intensity of the ±1st order ray diffracted due to the photomask is described by the following formula.

$$-I_n = A_M(f_1)^2 + B_M(f_2)^2 + 2A_M(f_1) \cdot B_M(f_1) \cdot \cos\{2\pi(f_1 - f_2)t - 2X_M/P'\}$$

It is readily understandable from these equations that the phase terms of the beat signals detected by photodetectors 20, 25 include relative displacements $X_W$, $X_M$ between the two rays' interference fringes 9, 9' and the alignment gratings 6, 24 formed on the semiconductor substrate 1 and on the photomask 10.

A phase difference y between the beat signal $I_W$ from the substrate 1 and the beat signal $I_n$ from the photomask 10 is measured, and then the semiconductor substrate 1 is moved so that the phase difference y approaches to zero. Thus the alignment of the photomask 10 and the semiconductor substrate 1 is achieved through a medium of two rays' interference fringes 9, 9'. After this alignment, the resist 80 is exposed through the photomask 10 and developed so that the second pattern 12 is formed on the semiconductor substrate 1. Then misalignment between the first pattern 5 and the second pattern 12 is measured.

FIG. 5(a) and FIG. 5(b) show a result of the resist coating evaluation in accordance with the present invention. The length and the direction of each arrow illustrated in FIG. 5(a) and FIG. 5(b) respectively represent the magnitude and direction of the misalignment.

In FIG. 5(a) a scaling error is observed in which the misalignment becomes large in the peripheral area of the semiconductor substrate 1. This indicates that the non-uniformity 14 of the resist appears prevailingly. As a result, the misalignment 16 becomes large in the peripheral area of the wafer because of the centrifugal force generated by the revolution of the wafer. In contrast, FIG. 5(b) shows that almost no misalignment occurs because the resist coating is optimized, and the resist is uniformly coated also in the peripheral area of the substrate.

In the present invention, the non-uniformity of the resist coating is evaluated by measuring the misalignment. The non-uniformity of the second resist coating can be evaluated by detecting the position of the alignment mark before and after applying the second resist and by measuring wafer scaling, orthogonality and wafer rotation change.

Although the described embodiment employs the specific overlay method utilizing two rays' interference, another different overlay method may be employed to achieve a similar result.

Although the described embodiment employs the specific curing method utilizing DUV irradiation, another different curing method, for instance, utilizing baking by a hot plate, etc. may be employed to achieve a similar result.

As described hereinbefore, the present invention enables the non-uniformity of the resist formed over a ridge portion to be evaluated easily and quantitatively. An improvement and an optimization of the resist coating using the present invention enables one to achieve high accuracy of an overlay and high controllability of a pattern dimension.

What is claimed:

1. A method for evaluating a resist coating comprising the steps of:

forming a first layer resist pattern and, a first layer resist alignment grating by applying a first resist on a semiconductor substrate, exposing said first resist with a first photomask and developing said first resist;

irradiating said first layer resist pattern with a deep ultraviolet ray;

applying, onto said irritated first layer resist pattern, a second resist having substantially the same refractive index as said first resist to form a second resist coating;

irradiating said first layer resist alignment grating simultaneously with light of a first frequency and light of a second frequency different from said first frequency to create an interference fringe pattern;

aligning a second photomask to said first alignment grating using said interference fringe pattern;

exposing said second resist with said second photomask and developing said second resist to form a second layer resist pattern; and determining non-uniformity characteristics of said second resist coating by measuring misalignment between said first layer resist pattern and said second layer resist pattern.

2. A method according to claim 1, wherein a difference in refractive index between said first resist and said second resist is not greater than 0.1.

3. A method for evaluating a resist coating comprising the steps of:

forming a first layer resist pattern and a first layer resist alignment grating by applying a first resist on a semiconductor substrate, exposing said first resist with a first photomask and developing said first resist;

irradiating said first layer resist pattern with a deep ultraviolet ray;

irradiating said first layer resist alignment grating simultaneously with light of a first frequency and light of a second frequency different from said first frequency to create a first interference fringe pattern;

performing alignment position detections with respect to said alignment grating in said first layer resist pattern, to measure a first plurality of values which correspond to wafer scaling, orthogonality and wafer rotation of said semiconductor substrate using said interference fringe pattern;

applying onto said irradiated first layer resist pattern, a second resist having substantially the same refractive index as said first resist;

performing alignment position detections with respect to said alignment grating in said first layer resist pattern with second resist, to measure a second plurality of values which correspond to wafer scaling, orthogonality and wafer rotation of said semiconductor substrate using said interference fringe pattern; and determining a difference between said first plurality of values and said second plurality of values in order to determine nonuniformity characteristics of said second resist coating.

4. A method for evaluating a resist coating comprising the steps of:

forming a first layer resist pattern and a first layer resist alignment grating by applying a first resist on a semiconductor substrate, exposing said first resist with a first photomask and developing said first resist;

baking said first layer resist pattern by means of a hot plate;

applying onto said first layer resist pattern, a second resist having a substantially the same refractive index as said first resist to form a second resist coating;

irradiating said first layer resist alignment grating simultaneously with light of a first frequency and light of a second frequency difference from said first frequency to create an interference fringe pattern;

aligning a second photomask to said first alignment grating using said interference fringe pattern;

exposing said second resist with said second photomask nd developing said second resist to form a second layer resist pattern; and determining non-uniformity characteristics of said second resist coating by measuring a misalignment between said first layer resist pattern and said second layer resist pattern.

* * * * *

UNITED STATES PATENT AND TRADEMARK OFFICE
CERTIFICATE OF CORRECTION

PATENT NO.   : 5,252,414
DATED        : October 12, 1993
INVENTOR(S)  : Kazuhiro Yamashita et al.

It is certified that error appears in the above-identified patent and that said Letters Patent is hereby corrected as shown below:

column 10, line 5, claim 4, "difference" should be --different--.

column 10, line 11, claim 4, the word "nd" should be --and--.

Signed and Sealed this

Eighteenth Day of October, 1994

Attest:

BRUCE LEHMAN

*Attesting Officer*     *Commissioner of Patents and Trademarks*